(12) United States Patent
Lee et al.

(10) Patent No.: US 9,287,518 B2
(45) Date of Patent: Mar. 15, 2016

(54) LIGHT EMITTING DEVICE USING GRAPHENE QUANTUM DOT AND ORGANIC LIGHT EMITTING DEVICE INCLUDING THE SAME

(71) Applicant: RESEARCH & BUSINESS FOUNDATION SUNGKYUNKWAN UNIVERSITY, Suwon-si (KR)

(72) Inventors: Hyoyoung Lee, Suwon-si (KR); Jung Hyun Lee, Gunpo-si (KR); Yong Hun Shin, Ansan-si (KR)

(73) Assignee: RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 14/091,556

(22) Filed: Nov. 27, 2013

(65) Prior Publication Data

US 2014/0145145 A1 May 29, 2014

(30) Foreign Application Priority Data

Nov. 29, 2012 (KR) .................. 10-2012-0137277

(51) Int. Cl.
*H01L 33/04* (2010.01)
*H01L 51/50* (2006.01)

(52) U.S. Cl.
CPC .......... *H01L 51/5012* (2013.01); *H01L 51/502* (2013.01); *H01L 51/5056* (2013.01); *H01L 51/5072* (2013.01)

(58) Field of Classification Search
CPC .. H01L 33/04; H01L 51/5012; H01L 51/5072
USPC .............. 313/498–512; 428/47, 690; 257/13, 257/E51.026
See application file for complete search history.

(56) References Cited

U.S. PATENT DOCUMENTS

| | | | |
|---|---|---|---|
| 2008/0268282 A1* | 10/2008 | Spindler et al. ............. | 428/690 |
| 2009/0212695 A1* | 8/2009 | Kim et al. .................... | 313/506 |
| 2012/0068154 A1* | 3/2012 | Hwang et al. ................ | 257/13 |

FOREIGN PATENT DOCUMENTS

| | | |
|---|---|---|
| KR | 10-2007-0041131 A | 4/2007 |
| KR | 10-2009-0091552 A | 8/2009 |
| KR | 10-2012-0029332 A | 3/2012 |
| KR | 10-2012-0067158 A | 6/2012 |

OTHER PUBLICATIONS

Gupta, Vinay, et al. "Luminscent graphene quantum dots for organic photovoltaic devices." *Journal of the American Chemical Society* vol. 133 (Jun. 2011): 9960-9963.

* cited by examiner

*Primary Examiner* — Cuong Q Nguyen
*Assistant Examiner* — Tong-Ho Kim
(74) *Attorney, Agent, or Firm* — NSIP Law (57) ABSTRACT

The present disclosure relates to a light emitting device using a graphene quantum dot, and an organic light emitting device including the same.

18 Claims, 10 Drawing Sheets

LIGHT EMITTING DEVICE USING GRAPHENE QUANTUM DOT AND ORGANIC LIGHT EMITTING DEVICE INCLUDING THE SAME

CROSS-REFERENCE TO RELATED APPLICATION

This application claims the benefit of Korean Patent Application No. 10-2012-0137277 filed on Nov. 29, 2012, the disclosures of which are incorporated herein by reference.

TECHNICAL FIELD

The present disclosure relates to a light emitting device using a graphene quantum dot and an organic light emitting device including the same.

BACKGROUND ART

Carbonaceous materials are base materials essential for development of modern science and technologies and have been supplied and developed as energy sources for human beings. These materials are being actively studied together with nano carbon materials, i.e., fullerene compounds (1985), carbon nanotubes (1991), and recently, graphene compounds (2004), which have been discovered as the nano science develops. Especially, graphene is a monolayer carbon compound having a 2D structure and has superior characteristics such as a large surface area, high carrier mobility, and strong mechanical strength. Accordingly, graphene is highly expected to act as a material, which replaces the market for silicon-based electronic devices. However, graphene has a problem in view of application thereof because aggregation occurs among graphenes so that a dispersibility of the graphenes in a general solvent is significantly decreased.

As one of methods for overcoming the problem, a small nano-sized graphene quantum dot method has been researched and developed over recent years. A graphene quantum dot compound is a 0D material having a size of from about a few nanometers to about tens of nanometers. The graphene quantum dot compound is easily dispersed in various organic solvents and has a light emitting characteristic. Accordingly, the graphene quantum dot compound can be applied to bio imaging researches, light emitting devices, and photoelectronic devices.

A conventional light emitting device using a graphene quantum dot directly uses a graphene quantum dot or a mixed form of the graphene quantum dot with an inorganic nano-material, e.g., ZnO nano-particles.

In case of directly using a graphene quantum dot, quantum efficiency in a photo-luminescent spectrum (PL) is very low (2 to 22.4%). This result causes significant decrease of device efficiency in realizing the device.

In addition, there has been reported a white LED using a ZnO-graphene quantum dot hybrid type of a graphene quantum dot obtained by reacting graphene with ZnO nano-particles. In this case, however, when the graphene quantum dot device was realized, significantly low brightness of 798 $cdm^{-2}$ was reported (Emissive ZnO-graphene quantum dots for white-light-emitting diodes, Nature Nanotechnology, 7, 465, 71, 2012).

As described above, the conventional light emitting device using a graphene quantum dot exhibits low light emitting efficiency as it uses a quantum dot having low quantum efficiency. In addition, when a device is manufactured by applying an organic material to an electron transport layer or a hole transport layer necessary for the device, high temperature deposition equipment should be used. Further, the organic material is not suitable for a flexible device due to its easy breaking property.

DISCLOSURE OF THE INVENTION

Problems to be Solved by the Invention

In order to solve the foregoing problems, the present disclosure provides a new light emitting device using a graphene quantum dot, which has high quantum efficiency through chemical or physical hybrid of a graphene quantum dot with an organic light emitting material.

In addition, the present disclosure can provide an electron transport layer material, which is formed by chemical or physical hybrid of an electron transport material with a graphene quantum dot, and a hole transport layer material, which is formed by chemical or physical hybrid of a hole transport material with a graphene quantum dot.

However, the problems sought to be solved by the present disclosure are not limited to those described above. Other problems, which are sought to be solved by the present disclosure but are not described herein, can be clearly understood by one of ordinary skill in the art from the descriptions below.

Means for Solving the Problems

In accordance with a first aspect of the present disclosure, there is provided a light emitting device using a graphene quantum dot, comprising a graphene quantum dot and an organic light emitting material which is chemically or physically hybridized with the graphene quantum dot.

In accordance with one illustrative embodiment of the present disclosure, the organic light emitting material may include a blue light emitting organic material, a green light emitting organic material, a red light emitting organic material, or a yellow light emitting organic material, but it may not be limited thereto.

In accordance with one illustrative embodiment of the present disclosure, the blue light emitting organic material may include one selected from the group consisting of 4,4-bis(2,2-diphenylethen-1-yl)-diphenyl (DPVBi), pyrene, perylene, distyrylbiphenyl, and combinations thereof, but it may not be limited thereto.

In accordance with one illustrative embodiment of the present disclosure, the green light emitting organic material may include one selected from the group consisting of tris(8-hydroxyquinolinato)aluminum (Alq3), quinacridone, diphenyltetracene (DPT), and combinations thereof, but it may not be limited thereto.

In accordance with one illustrative embodiment of the present disclosure, the red light emitting organic material may include one selected from the group tris(8-hydroxyquinoline)gallium (Gaq3), aminobenzothioxanthene (ABTX), 4-(dicyanomethylene)-2-t-butyl-6(1,1,7,7-tetramethyljulolidyl-9-enyl)-4H-pyran (DCJTB), and combinations thereof, but it may not be limited thereto.

In accordance with one illustrative embodiment of the present disclosure, the yellow light emitting organic material may include one selected from the group consisting of rubrene, benzothioxanthene (BTX), and combinations thereof, but it may not be limited thereto.

In accordance with a second aspect of the present disclosure, there is provided an organic light emitting device, comprising a cathode formed on a substrate, a hole transport layer, a light emitting layer, an electron transport layer, and an anode, wherein the light emitting layer includes a light emitting device using a graphene quantum dot.

In accordance with one illustrative embodiment of the present disclosure, the hole transport layer may include a substance selected from the group consisting of poly-triphenyldiamine (poly-TPD), poly(3,4-ethylenedioxythiophene)-poly(styrenesulfonate) (PEDOT-PSS), poly(p-phenylenvinylene) (PPV), poly(N-vinylcarbazole) (PVK), poly[9,9-dioctylfluorene-co-N-(4-butylphenyl)diphenylamine] (TFB), poly[9,9-dioctylfluorene-co-bis-N,N'-(4-butylphenyl)-bis-N,N'-phenyl-1,4-phenylenediamin] (PFB), 2-tert-butyl-9,10-di-naphthalen-2-yl-anthracene (TBADN), N,N'-bis(naphthalene-1-yl)-N,N'-bis(phenyl)-benzidine (NPB), Spiro-NPB, DMFL-NPB, DPFL-NPB, and combinations thereof, or a material formed by chemical or physical hybridization of the above substance with a graphene quantum dot, but it may not be limited thereto.

In accordance with one illustrative embodiment of the present disclosure, the hole transport layer may include one selected from a N-doped graphene oxide, a N-doped reduced graphene oxide, a graphene quantum dot, and combinations thereof, but it may not be limited thereto.

In accordance with one illustrative embodiment of the present disclosure, the hole transport layer may include a material formed by chemical or physical hybridization of one selected from a N-doped graphene oxide, a N-doped reduced graphene oxide, a graphene quantum dot, and combinations thereof, with a graphene quantum dot, but it may not be limited thereto.

In accordance with one illustrative embodiment of the present disclosure, the electron transport layer may include a substance selected from the group consisting of tris(8-hydroxyquinolinato)aluminum (Alq3), 1,3,5-tris(N-phenylbenzimiazole-2-yl)benzene (TPBi), 2-(4-Biphenylyl)-5-(4-tert-butylphenyl)-1,3,4-oxadiazole (PBD), 2,9-dimethyl-4,7-diphenyl-1,10-phenanthroline (BCP), bis(2-methyl-8-quinolinolato)(p-phenylphenolato) (Balq), 1,3-bis(N,N-t-butyl-phenyl)-1,3,4-oxadiazole (OXD7), and combinations thereof, or a material formed by chemical or physical hybridization of the above substance with a graphene quantum dot, but it may not be limited thereto.

In accordance with one illustrative embodiment of the present disclosure, the substrate may include glass, polyethyleneterephthalate (PET), polyethylene naphthalate (PEN), or polyimide (PI), but it may not be limited thereto.

In accordance with one illustrative embodiment of the present disclosure, the cathode may include one selected from the group consisting of graphene, indium tin oxide (ITO), Al-doped zinc oxide (AZO), Zn-doped indium oxide (IZO), Nb:SrTiO$_3$, Ga-doped ZnO (GZO), Nb-doped TiO$_2$, F-doped tin oxide (FTC)), and combinations thereof, but it may not be limited thereto.

In accordance with one illustrative embodiment of the present disclosure, the anode may include one selected from the group consisting of graphene, LiF/Al, CsF/Al, BaF$_2$/Al, LiF/Ca/Al, and combinations thereof, but it may not be limited thereto.

Effect of the Invention

According to the foregoing means for solving the problem of the present disclosure, the present disclosure can provide a superior light emitting device, which has light emitting efficiency enabling emission of blue, green, red or yellow light by physically or chemically hybridizing an organic light emitting material with a graphene quantum dot. In addition, when the light emitting device is formed of a graphene quantum dot-blue light emitting organic material and a graphene quantum dot-yellow light emitting organic material, it can emit white light. Further, when the light emitting device is formed of a graphene quantum dot-blue light emitting organic material, a graphene quantum dot-green light emitting organic material, and a graphene quantum dot-red light emitting organic material, it can emit white light. Since the graphene quantum dot-organic light emitting material is easily dispersed in a solvent, it can be stacked through a spray coating method, a layer-by-layer method or others. In addition, since such a light emitting device can be applied to various substrates including a flexible substrate, it can be effectively used for manufacture of a flexible device.

Especially, the present disclosure can solve the problem of evaporation of an organic material at a high temperature during manufacture of an organic light emitting device containing an electron transport layer, a light emitting layer and a hole transport layer. The present disclosure can manufacture an organic light emitting device even at a low temperature. The present disclosure can improve stability of an electron transport layer, a light emitting layer and a hole transport layer through chemical or physical hybrid of a graphene quantum dot with an organic light emitting material.

BEST MODE FOR CARRYING OUT THE INVENTION

Hereinafter, illustrative embodiments of the present disclosure will be described in detail with reference to the accompanying drawings so that inventive concept may be readily implemented by those skilled in the art. However, it is to be noted that the present disclosure is not limited to the illustrative embodiments but can be realized in various other ways. In the drawings, certain parts not directly relevant to the description are omitted to enhance the clarity of the drawings, and like reference numerals denote like parts throughout the whole document.

Throughout the whole document, the terms "connected to" or "coupled to" are used to designate a connection or coupling of one element to another element and include both a case where an element is "directly connected or coupled to" another element and a case where an element is "electronically connected or coupled to" another element via still another element.

Throughout the whole document, the term "on" that is used to designate a position of one element with respect to another element includes both a case that the one element is adjacent to the another element and a case that any other element exists between these two elements.

Throughout the whole document, the term "comprises or includes" and/or "comprising or including" used in the document means that one or more other components, steps, operations, and/or the existence or addition of elements are not excluded in addition to the described components, steps, operations and/or elements. Throughout the whole document, the terms "about or approximately" or "substantially" are intended to have meanings close to numerical values or ranges specified with an allowable error and intended to prevent accurate or absolute numerical values disclosed for understanding of the present invention from being illegally or unfairly used by any unconscionable third party. Through the whole document, the term "step of" does not mean "step for."

Throughout the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Throughout the whole document, the terms "A and/or B" mean "one or both of A and B."

The first aspect of the present disclosure can provide a light emitting device using a graphene quantum dot, including a graphene quantum dot and an organic light emitting material chemically or physically hybridized with the graphene quantum dot.

Figure 1:
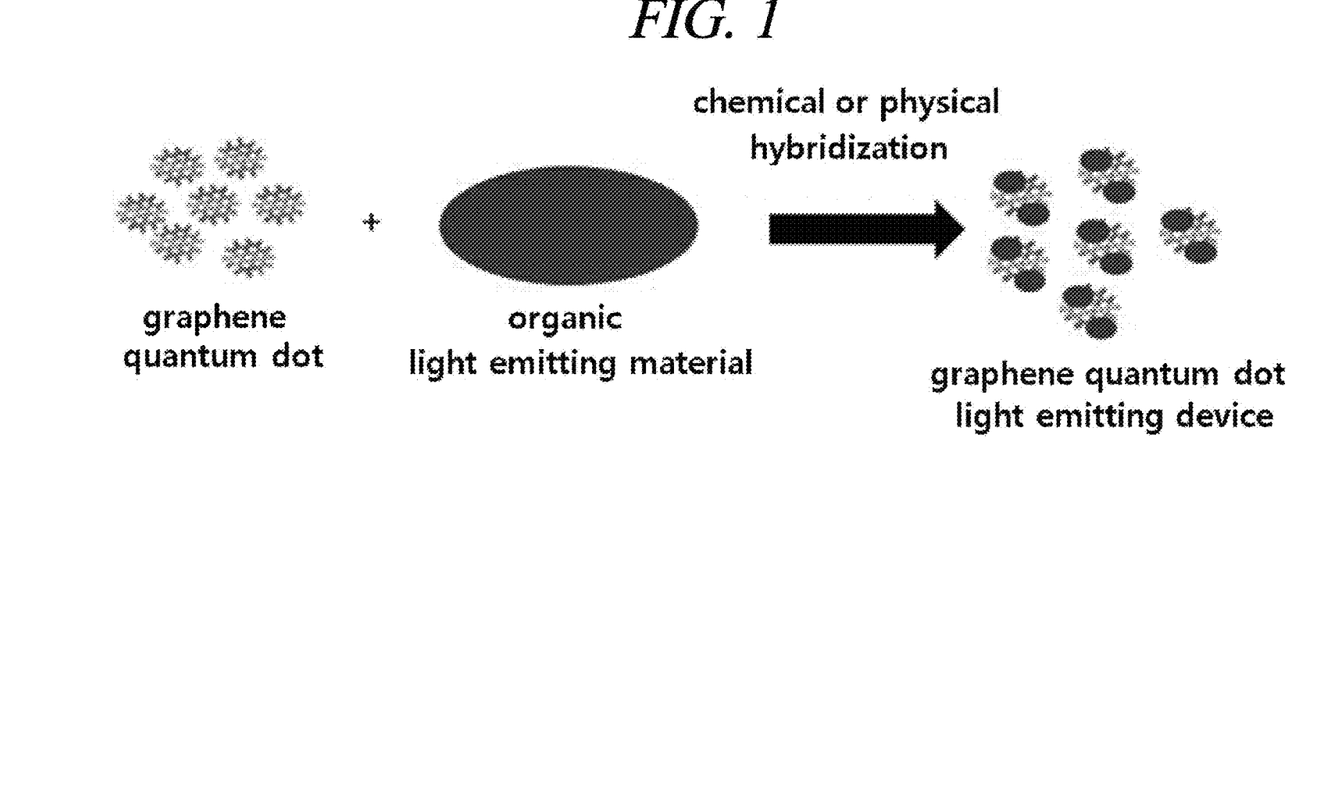
FIG. 1 is a flow chart of a method for manufacturing a light emitting device by using a graphene quantum dot in accordance with one illustrative embodiment of the present disclosure.

FIG. 1 is a flow chart of a method for manufacturing a light emitting device using a graphene quantum dot in accordance with one illustrative embodiment of the present disclosure. As shown in FIG. 1, a light emitting device using a graphene quantum dot according to the present disclosure can be manufactured by chemically or physically hybridizing an organic light emitting material with a graphene quantum dot.

Figure 3A:
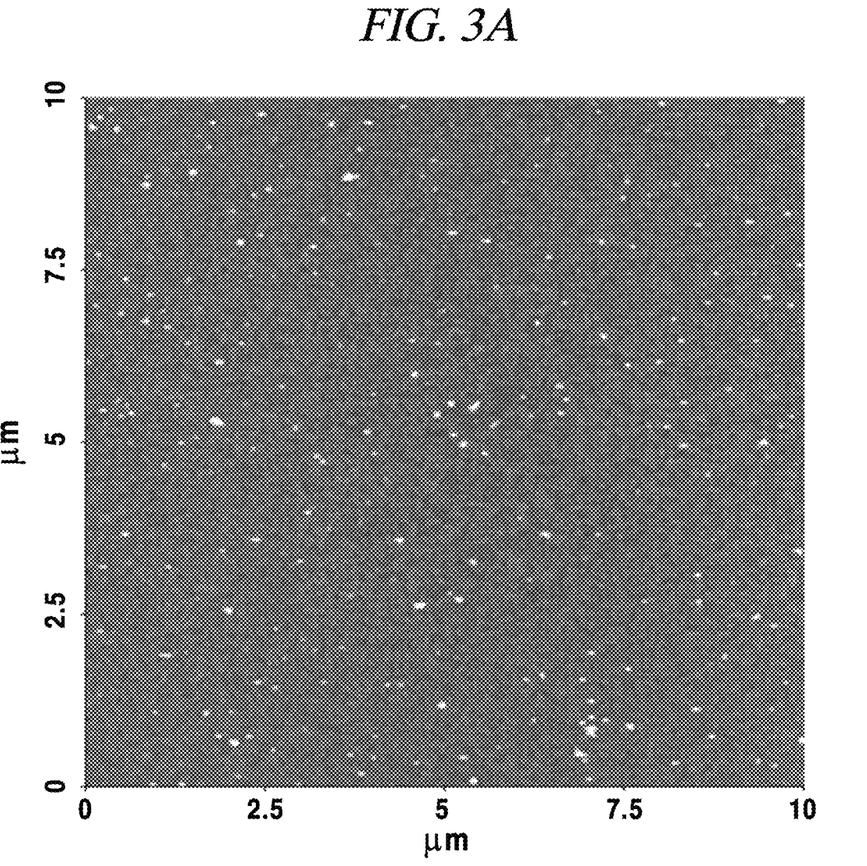
FIGS. 3A to 3C are atomic force microscope (AFM) photographs of a graphene quantum dot in accordance with an example of the present disclosure.
Figure 3B:
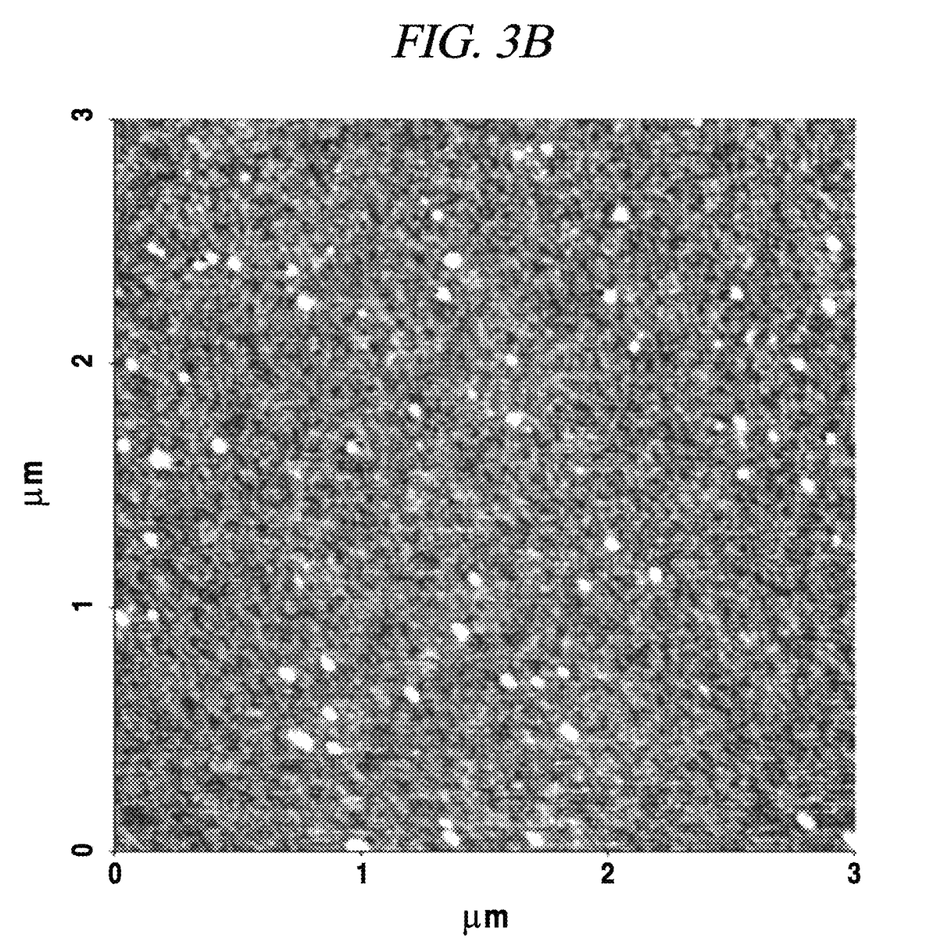
Figure 3C:
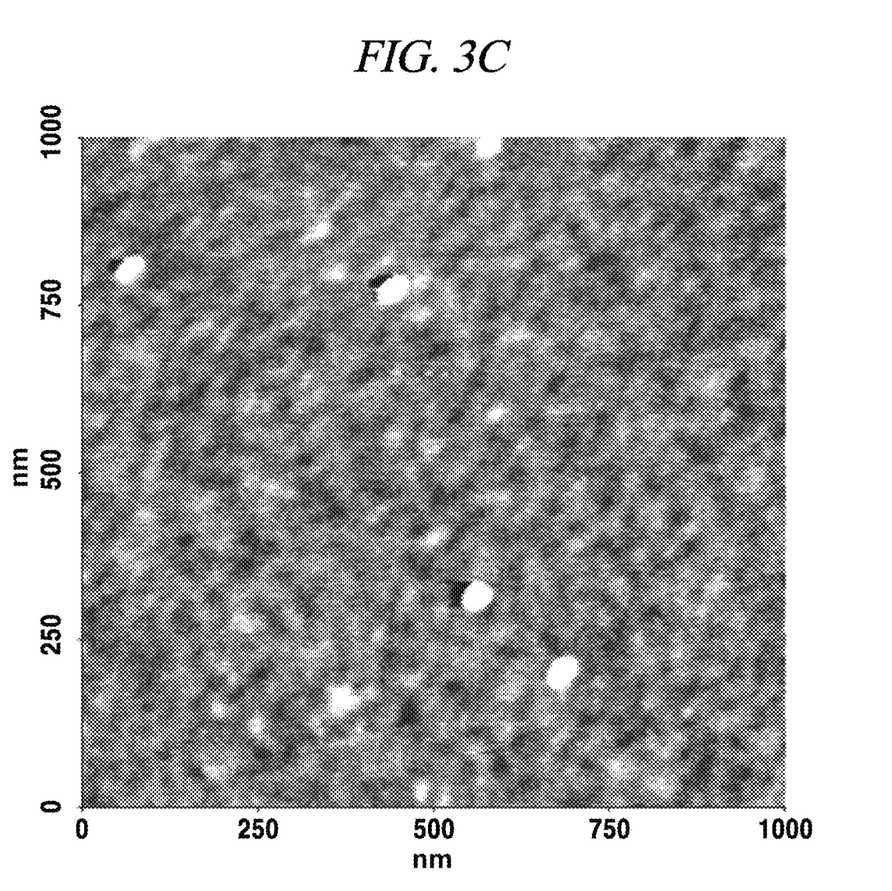

In the present disclosure, graphene means a conductive material, in which carbon atoms are arranged in a two-dimensional honeycomb form, and which has a thickness of one atomic layer. In the present disclosure, a graphene quantum dot means a zero (0)-dimensional material, which has a size of from approximately 1 nm to approximately 20 nm. FIGS. 3A to 3C are AFM photographs of a graphene quantum dot in accordance with an example of the present disclosure. As shown in FIGS. 3A to 3C, the graphene quantum dot may have a size of from approximately 1 nm to approximately 20 nm.

In the light emitting device using a graphene quantum dot, the graphene quantum dot and an organic light emitting material are chemically or physically hybridized with each other. For example, the chemical or physical hybrid may be chemical hybrid such as covalent bond or physical hybrid such as π-π stacking, but it may not be limited thereto.

For example, the organic light emitting material may include a blue light emitting organic material, a green light emitting organic material, a red light emitting organic material or a yellow light emitting organic material, but it may not be limited thereto.

For example, the blue light emitting organic material may include one selected from the group consisting of 4,4-bis(2,2-diphenylethen-1-yl)-diphenyl (DPVBi), pyrene, perylene, distyrylbiphenyl and combinations thereof, but it may not be limited thereto.

Figure 4:
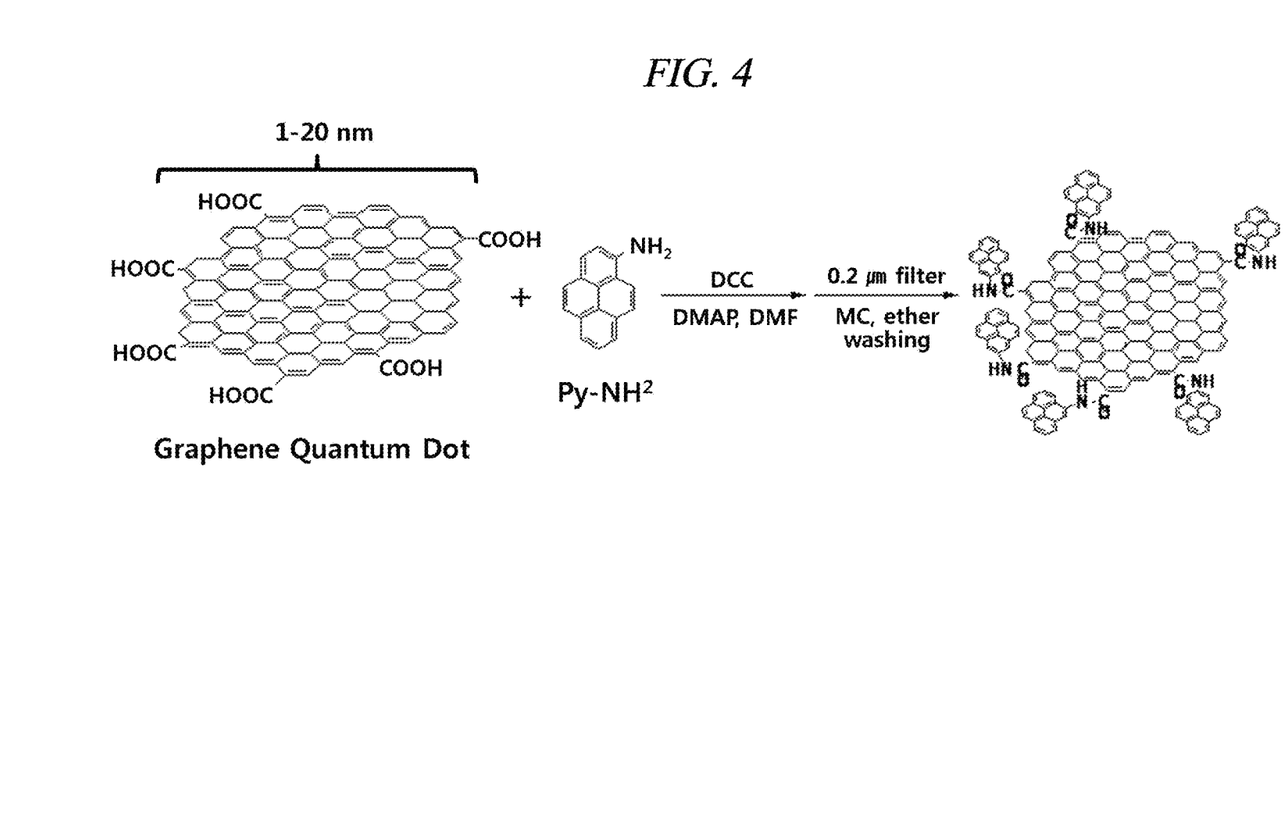
FIG. 4 is a process view for manufacture of a light emitting device using a graphene quantum dot in accordance with an example of the present disclosure.
Figure 5:
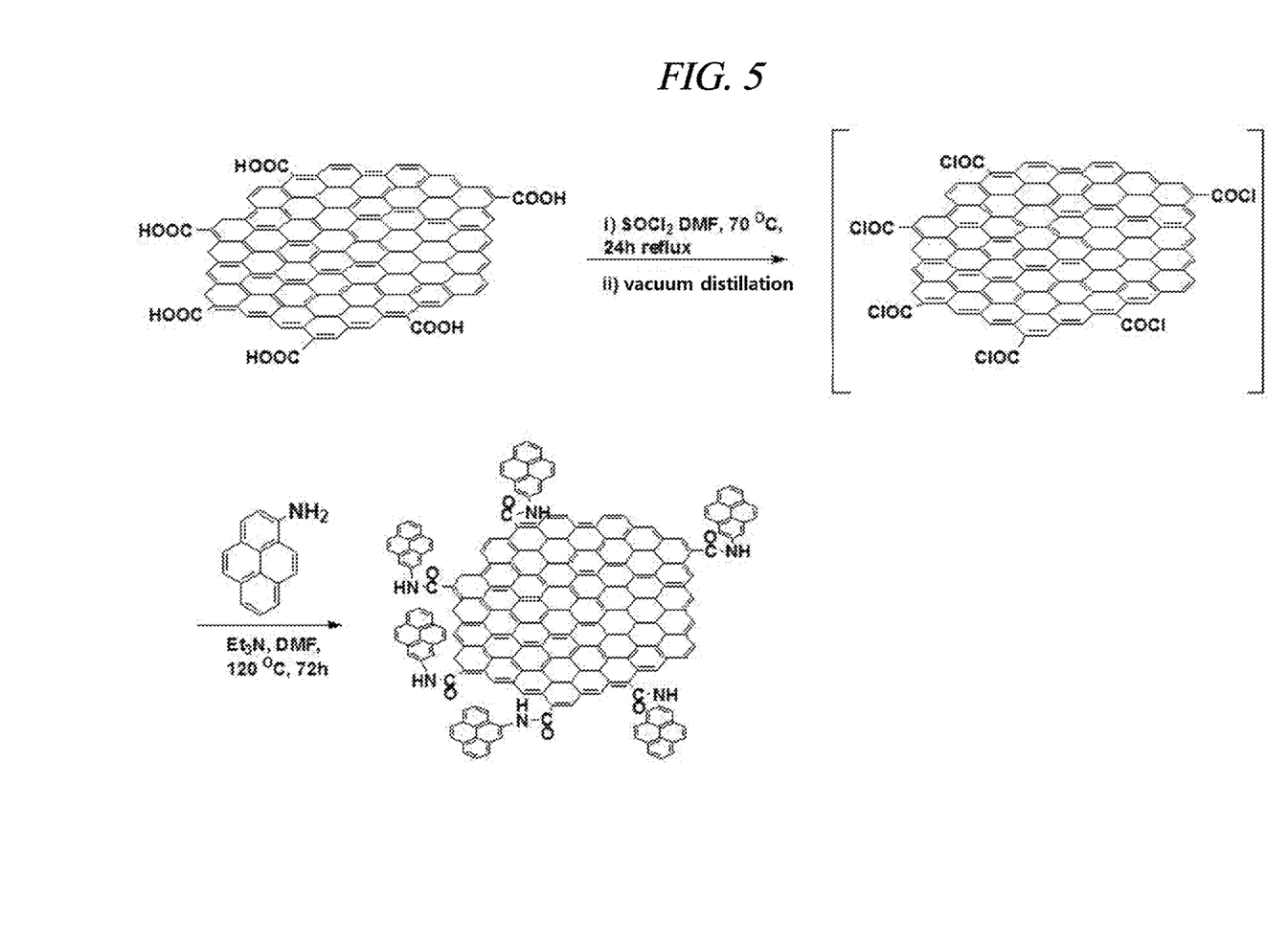
FIG. 5 is a process view for manufacture of a light emitting device using a graphene quantum dot in accordance with an example of the present disclosure.

FIGS. 4 and 5 are process views for manufacture of a quantum dot light emitting device emitting blue light by hybridizing a pyrene derivative (Py-$NH_2$) as a blue light emitting organic material with a graphene quantum dot. In the quantum dot light emitting device according to FIGS. 4 and 5, the graphene quantum dot and pyrene are hybridized with each other through covalent bond.

For example, the green light emitting organic material may include one selected from the group consisting of tris(8-hydroxyquinolinato)aluminum (Alq3), quinacridone, diphenyltetracene (DPT) and combinations thereof, but it may not be limited thereto.

For example, the red light emitting organic material may include one selected from the group consisting of tris(8-hydroxyquinoline)gallium (Gaq3), aminobenzothioxanthene (ABTX), 4-dicyanomethylene-2-t-butyl-6(1,1,7,7-tetramethyljulolidyl-9-enyl)-4H-pyran (DCJTB) and combinations thereof, but it may not be limited thereto.

For example, the yellow light emitting organic material may include one selected from the group consisting of rubrene, benzothioxanthene (BTX) and combinations thereof, but it may not be limited thereto.

Figure 6:
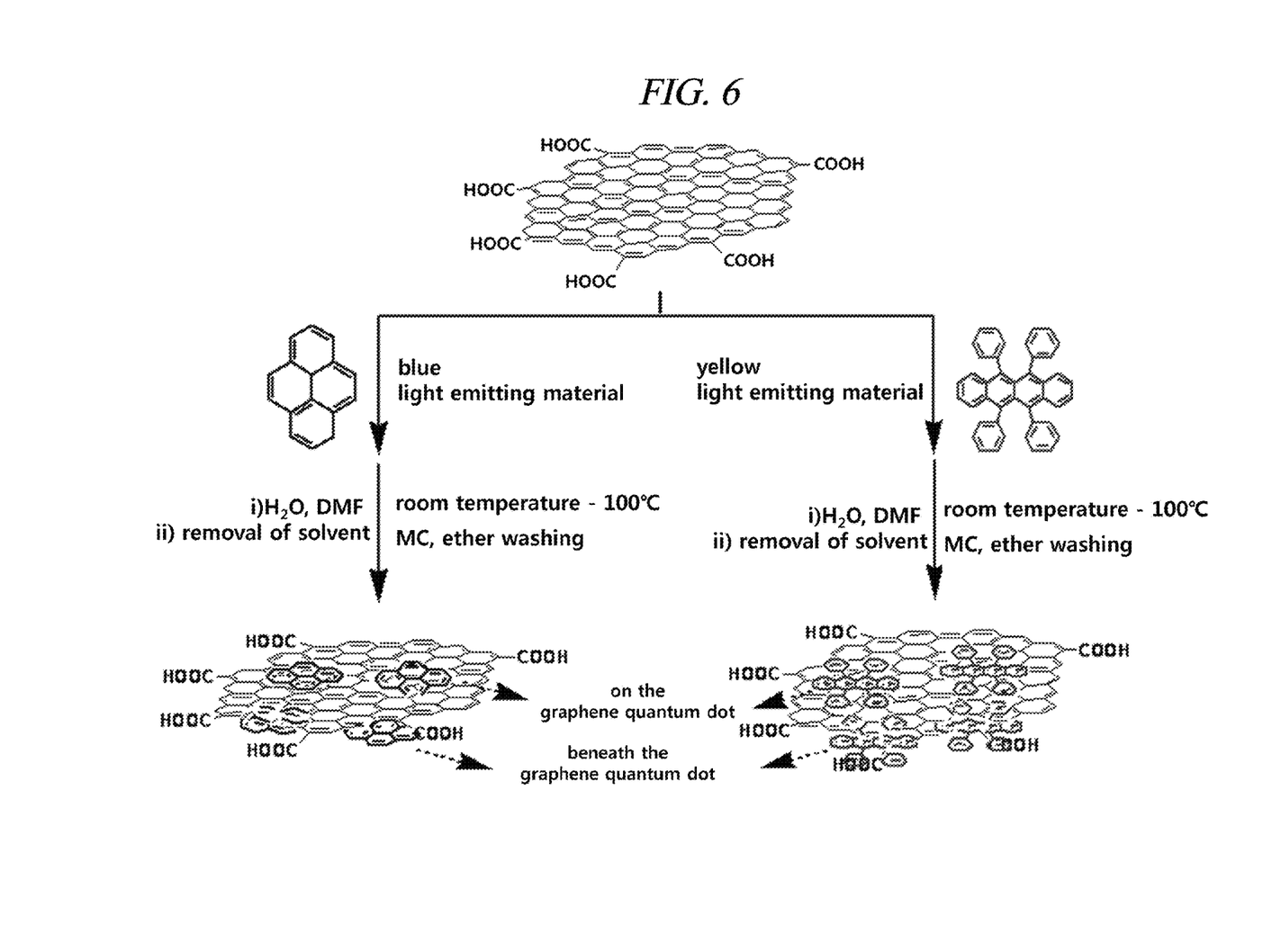
FIG. 6 is a process view for manufacture of a light emitting device using a graphene quantum dot in accordance with an example of the present disclosure.

FIG. 6 is a process view (left side) for manufacture of a quantum dot light emitting device emitting blue light by hybridizing pyrene as a blue light emitting organic material with a graphene quantum dot, and a process view (right view) for manufacture of a quantum dot light emitting device emitting yellow light by hybridizing rubrene as a yellow light emitting organic material with a graphene quantum dot. In the quantum dot light emitting device according to FIG. 6, the graphene quantum dot and pyrene or the graphene quantum dot and rubrene are hybridized with each other through π-π stacking.

The second aspect of the present disclosure can provide an organic light emitting device, which includes a cathode formed on a substrate, a hole transport layer, a light emitting layer, an electron transport layer and an anode, wherein the light emitting layer includes the light emitting device using a graphene quantum dot.

Figure 2:
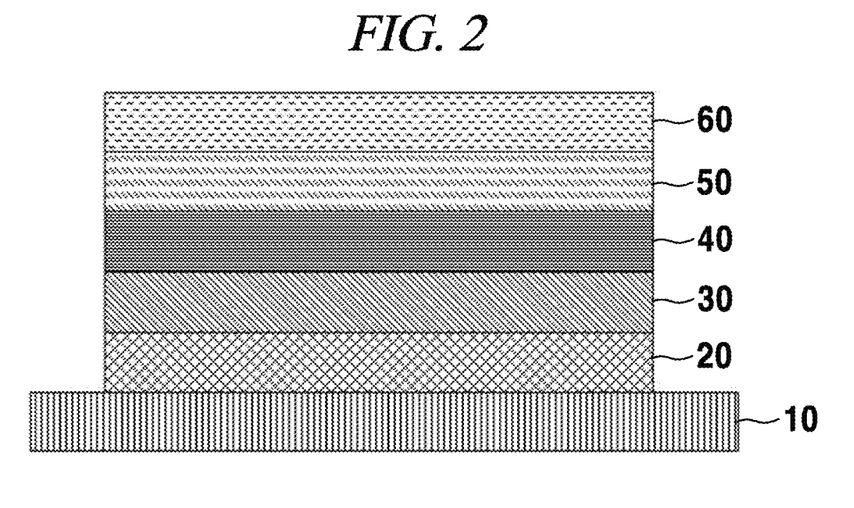
FIG. 2 is a cross-sectional view of an organic light emitting device in accordance with one illustrative embodiment of the present disclosure.

FIG. 2 is a cross-sectional view of an organic light emitting device in accordance with one illustrative embodiment of the present disclosure.

The organic light emitting device may include a substrate 10, a cathode 20, a hole transport layer 30, a light emitting layer 40, an electron transport layer 50, and an anode 60. The light emitting layer 40 includes the light emitting device using a graphene quantum dot, in which an organic light emitting material is chemically or physically hybridized with the graphene quantum dot.

In general, the organic light emitting device includes three layers, which include an electron transport layer, a light emitting layer including a unimolecular material having a light emitting characteristic, and a hole transport layer. When the conventional low molecular material was used as a light emitting layer, an organic light emitting device was produced by using organic material deposition method. However, since the deposition method could not be applied to a polymer, spin coating, spray method, and the likes were used for polymer. Since the former uses a deposition method, high price equipment was necessary and denaturalization of a substrate was a problem due to high temperature when the latest flexible substrate is used. The latter uses a wet process such as spin coating, however, it is not easy to choose a solvent which does not dissolve the layers or does not have a bad influence upon the layers when the layers are prepared by using the wet process. In addition, a color purity of a polymer is inferior to that of a low molecular material. Further, a low molecular material and a polymer are vulnerable to heat.

Further, if the unimolecular material contained in the light emitting layer contains impurities, the light emitting characteristic is significantly degraded. As such, the organic light emitting device should be manufactured under a stringent condition of a vacuum state through deposition of gas. Accordingly, there have been researches on manufacture of a light emitting layer, which contains a polymer material so as to maintain the light emitting characteristic even though the polymer material contains a small amount of impurities. However, since the polymer material is vulnerable to heat, it is easily degraded by heat during the formation of the electron transport layer or the hole transport layer on the light emitting layer containing the polymer material. However, in the quantum dot light emitting device of the present disclosure, the organic light emitting material is chemically or physically hybridized with the quantum dot. Accordingly, the quantum dot light emitting device of the present disclosure is stable to heat and has a highly superior light emitting characteristic. Thus, when the electron transport layer or the hole transport layer is formed on the light emitting layer including the quantum dot light emitting device including the polymer organic light emitting material according to the present disclosure, the organic light emitting material is not degraded. Further, the finally manufactured organic light emitting material can exhibit a superior light emitting characteristic.

The hole transport layer 30 may be a substance selected from the group consisting of poly-triphenyldiamine (poly-TPD), poly(3,4-ethylene dioxythiophene)-poly(styrene-sulfonate) (PEDOT-PSS), poly(p-phenylenvinylene) (PPV), poly(N-vinylcarbazole) (PVK), poly[9,9-dioctylfluorene-co-N-(4-butylphenyl)diphenyl amine] (TFB), poly[9,9-dioctylfluorene-co-bis-N,N'-(4-butylphenyl)-bis-N,N'-phenyl-1,4-phenylenediamine] (PFB), 2-tert-butyl-9,10-dinaphthalen-2-yl-anthracene (TBADN), N,N'-bis(naphthalene-1-yl)-N,N'-bis(phenyl)-benzidine (NPB), Spiro-NPB, DMFLNPB, DPFL-NPB and combinations, or a material formed by chemical or physical hybridization of the above substance with a graphene quantum dot, but it may not be limited thereto. For example, the chemical or physical hybrid may be covalent bond or π-π stacking, but it may not be limited thereto. When the hole transport layer 30 includes a material formed by chemical or physical hybrid of the graphene quantum dot, the flexibility of the hole transport layer increases, and thus, application to a flexible device is possible, but it may not be limited thereto. However, the present disclosure is not limited thereto. For example, the hole transport layer 30 may include one selected from the group consisting of nitrogen (N)-doped graphene oxide, nitrogen (N)-doped reduced graphene oxide, a graphene quantum dot, and combinations thereof, or a material formed by chemical or physical hybridization of one selected from a N-doped graphene oxide, a N-doped reduced graphene oxide, a graphene quantum dot, and combinations thereof, with a graphene quantum dot. In this case, as the flexibility of the hole transport layer increases, application to a flexible device is possible. However, the present disclosure may not be limited thereto.

The electron transport layer 50 may include a substance selected from the group consisting of tris(8-hydroxyquinolinato)aluminum (Alq3), 1,3,5-tris(N-phenylbenzimiazole-2-yl)benzene (TPBi), [2-(4-Biphenylyl)-5-(4-tert-butylphenyl)-1,3,4-oxadiazole] (PBD), 2,9-dimethyl-4,7-diphenyl-1,10-phenanthroline (BCP), bis(2-methyl-8-quinolinolato)(p-phenylphenolato) (Balq), 1,3-bis(N,N-t-butyl-phenyl)-1,3,4-oxadiazole (OXD7) and combinations thereof, or a material formed by chemical or physical hybrid of the above substance and a graphene quantum dot. However, the present disclosure may not be limited thereto. For example, the chemical or physical hybrid may be covalent bond or π-π stacking, but it may not be limited thereto. When the electron transport layer 50 includes a material formed by chemical or physical hybrid of the graphene quantum dot, the flexibility of the hole transport layer increases, and thus, application to a flexible device is possible. However, the present disclosure may not be limited thereto.

The hole transport layer 30, the light emitting layer 40 and/or the electron transport layer 50 may be formed by a method known in the art of the present disclosure. For example, the hole transport layer 30, the light emitting layer 40 and/or the electron transport layer 50 may be formed by spray coating, spin coating, deep coating, gravure coating, off-set coating, etc., but may not be limited thereto. When the hole transport layer 30, the light emitting layer 40 and/or the electron transport layer 50 are formed by the spray coating, due to the strong chemical or physical hybrid between the graphene quantum dot and the organic light emitting material, it is possible to suppress degradation of the organic light emitting material at a high temperature.

The substrate 10 may be a hard substrate, e.g., a glass substrate, but it may not be limited thereto. The substrate 10 may include a flexible substrate, e.g., polyethyleneterephthalate (PET), polyethylene naphthalate (PEN) or polyimide (PI), but it may not be limited thereto. When a flexible substrate is used for the substrate 10, application to a flexible device is possible.

For example, the cathode 20 may include one selected from the group consisting of graphene, indium-tin-oxide (ITO), Al-doped zinc oxide (AZO), Zn-doped indium oxide (IZO), Nb:SrTiO$_3$, Ga-doped ZnO (GZO), Nb-doped TiO$_2$, F-doped tin oxide (FTC)), and combinations thereof, but it may not be limited thereto.

For example, the anode may include one selected from the group consisting of graphene, LiF/Al, CsF/Al, BaF$_2$/Al, LiF/Ca/Al and combinations thereof, but it may not be limited thereto.

In accordance with an illustrative embodiment, the light emitting layer may include one selected from the group consisting of a blue light emitting organic material, a green light emitting organic material, a red light emitting organic material, a yellow light emitting organic material, and combinations thereof, and the organic light emitting device may emit white light.

Hereinafter, the present disclosure is described with examples more in detail, but it may not be limited thereto.

PREPARATION EXAMPLES

A process for preparing a graphene quantum dot used in an example of the present disclosure is described hereinafter. About 5 g of graphene oxide prepared by a modified Hummers method was added to 1 L (5 mg/1 mL) of dimethylformamide and subject to sonication for one day. The graphene oxide solution, which has not been sufficiently dispersed, was further dispersed by using an ultrasonication (750 W, 2 h). 70 mL of the dispersed graphene oxide solution was moved into a 100 mL Teflon vessel, and then, reacted in a solvothermal reaction device at about 200° C. for about 20 hours. After the reaction finished, the solution was distilled in vacuum to remove the solvent (dimethylformamide). Thereafter, the graphene quantum dot was purified through column chromatography. For eluents, a methanol dichloromethan mixture solution was used as a first eluent, and distilled water was used as a second eluent. Once each of the eluents was collected and distilled in vacuum to remove the solvent, a graphene quantum dot in a yellow oil form was obtained from the first eluent, and a graphene quantum dot in a light yellow solid form was obtained from the second eluent. For analysis of the synthesized graphene quantum dots, the graphene quantum dot obtained from the second eluent, which accounts for a large amount therein, was used.

Sampling for measuring a size of the prepared graphene quantum dot was conducted as follows. Specifically, a silicon substrate was dipped in acetone to be treated by ultrasonic waves for about 15 minutes. The silicon substrate was dipped in distilled water to be treated by ultrasonic waves for about 15 minutes. Thereafter, the substrate was placed into a mixture solution of hydrogen peroxide and sulfuric acid (1:2) for about 30 minutes to sufficiently eliminate organic contaminants and then sufficiently washed with distilled water. Subsequently, the substrate was placed into distilled water to be treated by ultrasonic waves for about 15 minutes and placed into ethanol to be treated by ultrasonic waves for about 15 minutes. Thereafter, the substrate was dried by sufficiently injecting a high purity nitrogen gas thereto. A from about 0.3 to about 1 mg/mL aqueous solution of the prepared graphene quantum dot was prepared to be used as a spin coating solution. The spin coating solution was dropped onto the silicon substrate. After from about 5 to about 30 minutes, the silicon substrate was spun at from about 3,000 rpm to about 5,000 rpm for from about 10 to about 60 seconds. The substrate was dried in an about 80° C. vacuum oven for about one day, and thereafter, a size thereof was measured by using an atomic force microscopy (AFM) (FIGS. 3A to 3C). As shown in FIGS. 3A to 3C, the size of the graphene quantum dot used in the present disclosure was from about 1 nm to about 20 nm, and the height thereof was from about 1 to about 2 nm.

Example 1

A process for forming covalent bond of the graphene quantum dot and the organic light emitting material was performed as follows. The processes were same except that a different type of a light emitting material was used. 100 mg of the prepared graphene quantum dot, 200 mg of 1-aminopyrene, 200 mg of N,N'-dicyclohexylcarboimide (DCC), and 50 mg of 4-dimethylaminopyridine (DMAP) were dispersed in 100 mL of N,N'-dimethylformamide (DMF). The solution was fully stirred at a room temperature or 80° C. for at least 12 or 20 hours, and then, distillated in vacuum to remove the solvent. In order to remove an excessive amount of aminopyrene, 100 mL of methylenechloride (MC) was added thereto and fully stirred. Thereafter, the solution was filtered by using a 200 micrometer membrane filter. After the solid obtained from the filtering was washed several times with methanol and ether, respectively, it was collected and dried in vacuum at 80° C. (refer to FIG. 4).

Example 2

Another process for forming covalent bond of the graphene quantum dot with the organic light emitting material was performed as follows. The processes were same except that a different type of a light emitting material was used. Specifically, 100 mg of the prepared graphene quantum dot was added to 50 mL of DMF and dispersed therein. 100 mL of thionylchloride ($SOCl_2$) was added thereto, and then, stirred at 70° C. for 24 hours. After the reaction finished, the solution was distilled in vacuum to remove DMF and excess thionylchloride. Thereafter, 4 mL of triethylamine ($NEt_3$) and 200 mg of 1-aminopyrene were fully dispersed in 100 mL of N,N'-dimethylformamide (DMF). The solution was fully stirred at 120° C. for 24 hours and distillated in vacuum to remove the solvent. In order to remove an excessive amount of aminopyrene, 100 mL of methylenechloride (MC) was added thereto and stirred. Thereafter, the solution was filtered by using a 200 micrometer membrane filter. The solid obtained from the filtering was washed several times with methanol and ether, respectively, it was collected and dried in vacuum at 80° C. (refer to FIG. 5).

Example 3

A process for forming physical π-π bond between the graphene quantum dot and the organic light emitting material was performed as follows. The processes were same except that a different type of a light emitting material was used. A representative process for preparing a graphene quantum dot-aminopyrene compound hybrid is described hereinafter. 100 mg of the prepared graphene quantum dot was added to 50 mL of DMF and dispersed therein. Sodium carbonate ($NaCO_3$) was added thereto to adjust pH to be 10. Thereafter, 2 g of sodiumborohydride ($NaBH_4$) was added thereto and stirred at 80° C. for 12 hours. The solution was cooled to be a room temperature, and then, 200 mg of 1-aminopyrene was added thereto and stirred at 80° C. for 24 hours. Thereafter, the solution was distillated in vacuum to remove the solvent. In order to remove an excessive amount of pyrene carboxylic acid, 100 mL of methylenechloride (MC) was added thereto and fully stirred. Thereafter, the solution was filtered by using a 200 micrometer membrane filter. The solid obtained from the filtering was washed several times with methanol and ether, respectively, it was collected and dried in vacuum at 80° C. (refer to FIG. 6).

Experimental Example

Figure 7:
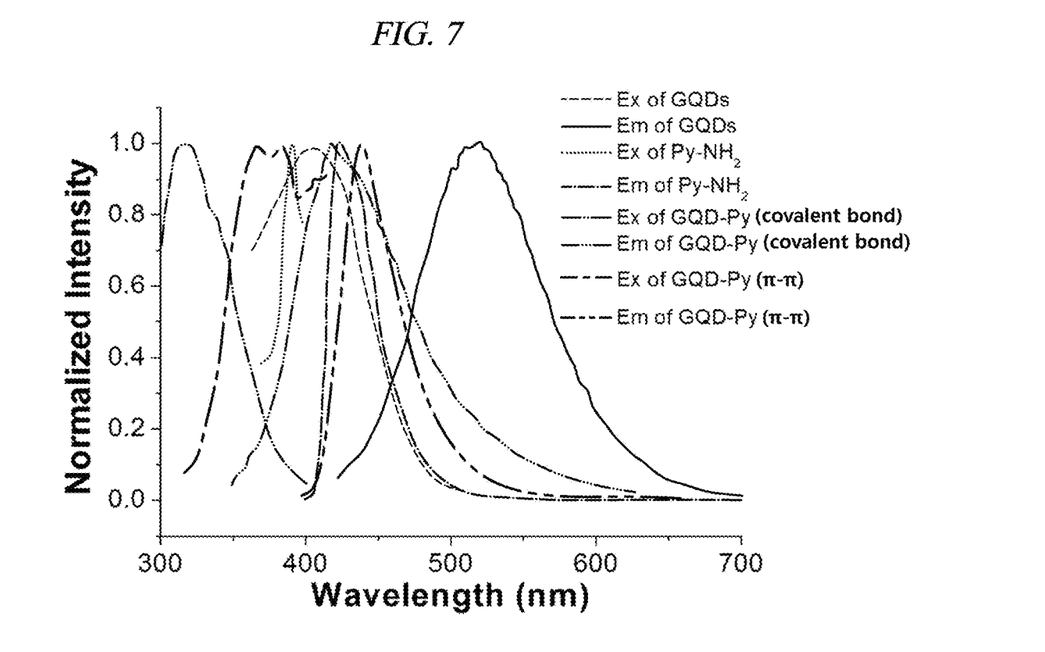
FIG. 7 is a graph showing luminescence of a light emitting device using a graphene quantum dot in accordance with an example of the present disclosure.

FIG. 7 is a graph showing an excitation (Ex) spectrum and an emission (Em) spectrum of the prepared graphene quantum dot, aminopyrene ($Py-NH_2$), the graphene quantum dot-light emission material, which is hybridized through covalent bond [GQD-Py(covalent bond)], and the graphene quantum dot-light emitting material, which is hybridized by π-π bond [GQD-Py(π-π)]. As shown in FIG. 7, the emission spectrum of the graphene quantum dot (Em of GQDs) was 510 nm and appeared in the green area, and the emission spectrum of aminopyrene (Em of $Py-NH_2$) was 423 nm and appeared in the blue area. On the other hand, the GQD-Py (covalent bond) was 420 nm and appeared in the blue area, which slightly moves toward a short wavelength. Meanwhile, the GQD-Py (π-π) was 436 nm and slightly moved toward a long wavelength, compared to that of the GQD-Py (covalent bond). However, the spectrum of the GQD-Py(π-π) exhibited a much sharper peak than that of the GQD-Py (covalent bond). This shows that the GQD-Py(π-π) is a much clearer blue light emitting material than the GQD-Py (covalent bond).

Example 4

A process for forming π-π bond between the graphene quantum dot and the hole or electron transport material was performed as follows. The processes were same, except that a different type of a hole or electron transport material was used. A representative process for preparing a graphene quantum dot-NPD (hole transport material) compound hybrid is described hereinafter. 100 mg of the prepared graphene quantum dot was added to 50 mL DMF and dispersed therein. Sodium carbonate ($NaCO_3$) was added thereto to adjust pH to be 10, and then, 2 g of sodiumborohydride ($NaBH_4$) was added thereto and stirred at 80° C. for 12 hours. The solution was cooled to be a room temperature, 200 mg of NPD was added thereto and stirred at 80° C. for 24 hours. Thereafter, the solution was distilled in vacuum to remove the solvent. In order to remove an excessive amount of a NPD compound, 100 mL of methylenechloride (MC) was added thereto and stirred. Thereafter, the solution was filtered by using a 200 micrometer membrane filter. After the solid obtained from the filtering was washed several times with methanol and ether, respectively, it was collected and dried in vacuum at 80° C.

Example 5

Figure 8:
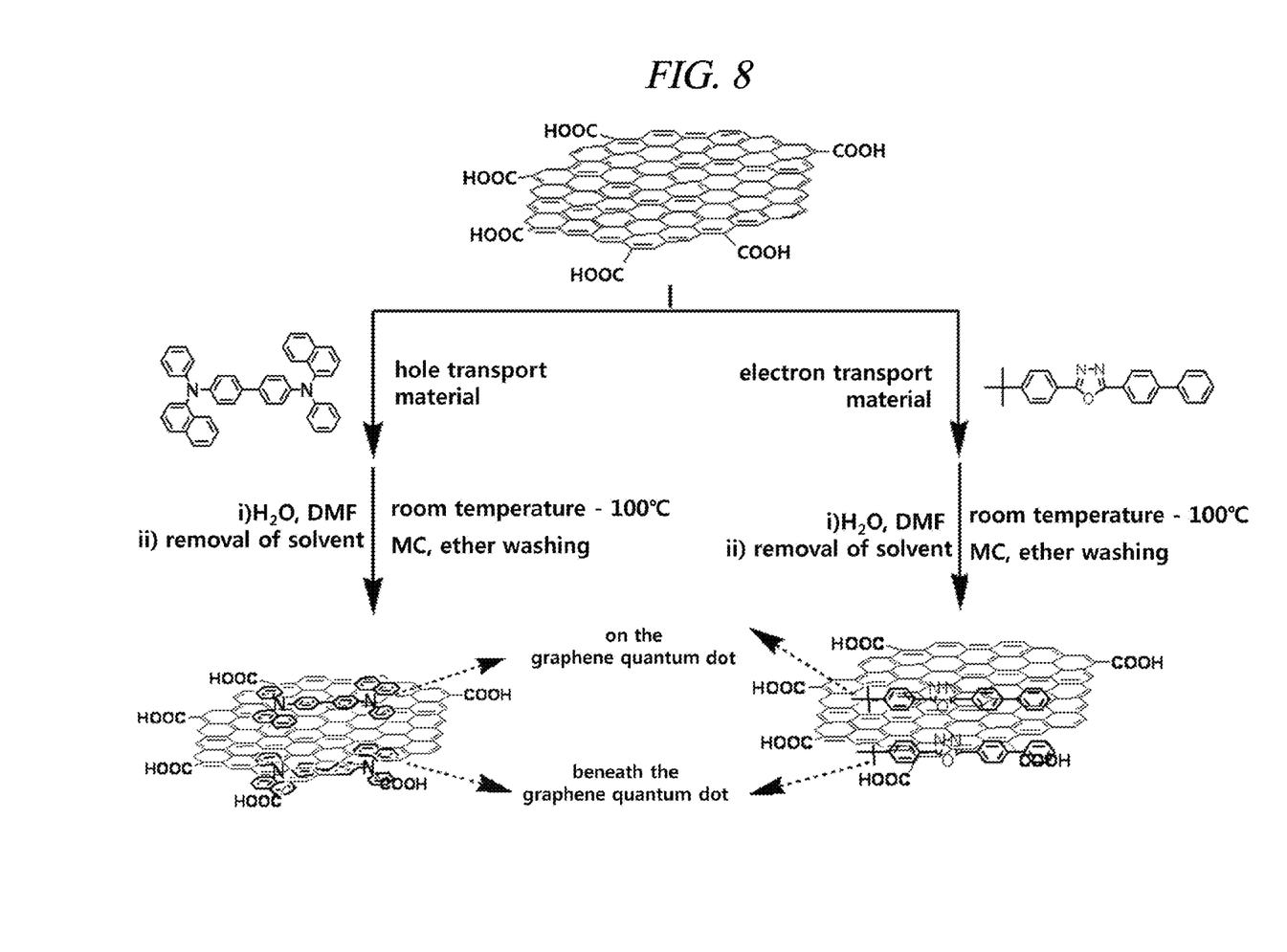
FIG. 8 is a process view for manufacture of a hole transport material and an electron transport material of a light emitting device using a graphene quantum dot in accordance with an example of the present disclosure.

A process for preparing a nitrogen (N)-doped graphene quantum dot used as a hole transport material in the present disclosure was performed as follows. 5 g of graphene oxide prepared by a modified Hummers method was added to 1 L (5 mg/1 mL) of dimethylformamide and subject to sonication for one day. The graphene oxide, which has not been sufficiently dispersed, was further dispersed by using an ultrasonication (750 W, 2 h). 70 mL of the dispersed graphene oxide solution and 10 mL of ammonia water were moved into a 100 mL Teflon vessel, and then, reacted in a solvothermal reaction device at 200° C. for 20 hours. After the reaction finished, the solution was filtered by using a 200 nm membrane filter. The solid obtained from the filtering was removed, and the yellow solution was heated and stirred at 100° C. for 12 hours to remove an excessive amount of the ammonia water. After the reaction finished, the solution was distilled in vacuum to remove the solvent (dimethylformamide). Thereafter, the nitrogen-doped graphene quantum dot was purified through column chromatography. For eluents, a methanol methylenechloride mixture solution was used as a first eluent, and distilled water was used as a second eluent. A yellow nitrogen-doped graphene quantum dot solid was obtained from the distilled water eluent (refer to FIG. 8).

The above description of the illustrative embodiments is provided for the purpose of illustration, and it would be understood by those skilled in the art that various changes and modifications may be made without changing technical conception and essential features of the illustrative embodiments. Thus, it is clear that the above-described illustrative embodiments are illustrative in all aspects and do not limit the present disclosure. For example, each component described to be of a single type can be implemented in a distributed manner. Likewise, components described to be distributed can be implemented in a combined manner.

The scope of the inventive concept is defined by the following claims and their equivalents rather than by the detailed description of the illustrative embodiments. It shall be understood that all modifications and embodiments conceived from the meaning and scope of the claims and their equivalents are included in the scope of the inventive concept.

EXPLANATION OF CODES

10: Substrate
20: Cathode
30: Hole transport layer
40: Light emitting layer
50: Electron transport layer
60: Anode

What is claimed is:

1. A light emitting device using a graphene quantum dot, comprising: a graphene quantum dot and an organic light emitting material which is chemically or physically hybridized with the graphene quantum dot, wherein the organic light emitting material is hybridized with the graphene quantum dot by a covalent bond or π-π stacking.

2. The light emitting device using a graphene quantum dot of claim 1, wherein the organic light emitting material includes a blue light emitting organic material, a green light emitting organic material, a red light emitting organic material, or a yellow light emitting organic material.

3. The light emitting device using a graphene quantum dot of claim 2, wherein the blue light emitting organic material includes one selected from the group consisting of 4,4-bis(2,2-diphenylethen-1-yl)-diphenyl, pyrene, perylene, distyrylbiphenyl, and combinations thereof.

4. The light emitting device using a graphene quantum dot of claim 2, wherein the green light emitting organic material includes one selected from the group consisting of tris(8-hydroxyquinolinato)aluminum, quinacridone, diphenyltetracene, and combinations thereof.

5. The light emitting device using a graphene quantum dot of claim 2, wherein the red light emitting organic material includes one selected from the group consisting of tris(8-hydroxyquinoline)gallium, aminobenzothioxanthene, 4-(dicyanomethylene)-2-t-butyl-6(1,1,7,7-tetramethyljulolidyl-9-enyl)-4H-pyran, and combinations thereof.

6. The light emitting device using a graphene quantum dot of claim 2, wherein the yellow light emitting organic material includes one selected from the group consisting of rubrene, benzothioxanthene, and combinations thereof.

7. An organic light emitting device, comprising:
a cathode formed on a substrate, a hole transport layer, a light emitting layer, an electron transport layer, and an anode, wherein the light emitting layer includes a light emitting device using a graphene quantum dot of claim 1.

8. The organic light emitting device of claim 7, wherein the hole transport layer includes a substance selected from the group consisting of poly-triphenyldiamine, poly(3,4-ethylenedioxythiophene)-poly(styrene-sulfonate), poly(p-phenylenvinylene), poly(N-vinylcarbazole), poly[9,9'-dioctylfluorene-co-N-(4-butylphenyl)diphenyl amine], poly[9,9-dioctylfluorene-co-bis-N,N'-(4-butylphenyl)-bis-N,N-phenyl-1,4-phenylenediamin], 2-tert-butyl-9,10-dinaphthalen-2-yl-anthracene, N,N'-bis(naphthalene-1-yl)-N,N-bis(phenyl)-benzidine, Spiro-NPB, DMF-LNPB, DPFL-NPB, and combinations thereof, or a material formed by chemical or physical hybridization of the above substance with a graphene quantum dot.

9. The organic light emitting device of claim 7, wherein the hole transport layer includes one selected from a N-doped graphene oxide, a N-doped reduced graphene oxide, a graphene quantum dot, and combinations thereof.

10. The organic light emitting device of claim 7, wherein the hole transport layer includes a material formed by chemical or physical hybridization of one selected from a N-doped graphene oxide, a N-doped reduced graphene oxide, a graphene quantum dot, and combinations thereof, with a graphene quantum dot.

11. The organic light emitting device of claim 7, wherein the electron transport layer includes a substance selected from the group consisting of tris(8-hydroxyquinolinato)aluminum, 1,3,5-tris(N-phenylbenzimiazole-2-yl)benzene, 2-(4-Biphenylyl)-5-(4-tert-butylphenyl)-1,3,4-oxadiazole, 2,9-dimethyl-4,7-diphenyl-1,10-phenanthroline, bis(2-methyl-8-quinolinolato)(p-phenylphenolato), 1,3-bis(N,N-t-butyl-phenyl)-1,3,4-oxadiazole, and combinations thereof, or a material formed by chemical or physical hybridization of the above substance with a graphene quantum dot.

12. The organic light emitting device of claim 7, wherein the substrate includes glass, polyethyleneterephthalate, polyethylene naphthalate, or polyimide.

13. The organic light emitting device of claim 7, wherein the cathode includes one selected from the group consisting of graphene, indium tin oxide, Al-doped zinc oxide, Zn-doped indium oxide, $Nb:SrTiO_3$, Ga-doped ZnO, Nb-doped $TiO_2$, F-doped tin oxide, and combinations thereof.

14. The organic light emitting device of claim 7, wherein the anode includes one selected from the group consisting of graphene, LiF/Al, CsF/Al, $BaF_2$/Al, LiF/Ca/Al, and combinations thereof.

15. The organic light emitting device of claim 7, wherein the light emitting layer includes a blue light emitting organic material, a green light emitting organic material, and a red light emitting organic material; and the organic light emitting device emits white light.

16. The organic light emitting device of claim 7, wherein the light emitting layer includes a blue light emitting organic material and a yellow light emitting organic material; and the organic light emitting device emits white light.

17. The organic light emitting device of claim 7, wherein the cathode formed on the substrate, the hole transport layer, the light emitting layer, the electron transport layer, and the anode are configured in this order.

18. The light emitting device using a graphene quantum dot of claim 1, wherein the light emitting device further comprises an electron transport material which is chemically or physically hybridized with an additional graphene quantum dot, or a hole transport material which is chemically or physically hybridized with an additional graphene quantum dot.

* * * * *